(12) United States Patent
Rastegar et al.

(10) Patent No.: US 8,259,292 B2
(45) Date of Patent: *Sep. 4, 2012

(54) SYSTEM AND METHOD FOR PROVIDING SCANNING POLARIZED REFERENCE SOURCES

(75) Inventors: Jahangir S. Rastegar, Stony Brook, NY (US); Thomas Spinelli, East Northport, NY (US)

(73) Assignee: Omnitek Partners LLC, Ronkonkoma, NY (US)

( * ) Notice: Subject to any disclaimer, the term of this patent is extended or adjusted under 35 U.S.C. 154(b) by 1043 days.

This patent is subject to a terminal disclaimer.

(21) Appl. No.: 12/191,295

(22) Filed: Aug. 13, 2008

(65) Prior Publication Data

US 2012/0146843 A1    Jun. 14, 2012

Related U.S. Application Data

(63) Continuation of application No. 11/888,797, filed on Aug. 2, 2007.

(60) Provisional application No. 60/835,022, filed on Aug. 2, 2006.

(51) Int. Cl.
*G01B 11/26* (2006.01)
*G01C 1/00* (2006.01)
*G01S 13/00* (2006.01)

(52) U.S. Cl. ......... 356/138; 342/147; 342/157; 342/158

(58) Field of Classification Search ............... 356/138; 342/28, 62, 118, 126, 146, 147, 154, 157, 342/158; 343/756, 757, 762, 772, 775

See application file for complete search history.

(56) References Cited

U.S. PATENT DOCUMENTS

| | | | |
|---|---|---|---|
| 6,724,341 B1 * | 4/2004 | Pereira et al. | 342/62 |
| 7,154,392 B2 * | 12/2006 | Rastegar et al. | 340/552 |
| 7,193,556 B1 * | 3/2007 | Pereira et al. | 342/62 |
| 7,425,918 B2 * | 9/2008 | Rastegar et al. | 342/173 |
| 7,865,152 B2 * | 1/2011 | Brown | 455/91 |
| 2007/0001051 A1 * | 1/2007 | Rastegar et al. | 244/3.1 |

* cited by examiner

Primary Examiner — Michael A Lyons

(57) ABSTRACT

A method of providing a polarized radio frequency scanning source is provided. The method including amplitude modulating at least two synchronized polarized radio frequency (RF) carrier signals with a predetermined relationship between their amplitude modulation of their electric field components and their polarization states to provide a scanning polarized RF reference source with a desired scanning range, pattern and frequency. The two or more synchronized polarized RF carrier signals with the predetermined relationship between their amplitude modulation can obtain a periodic or non-periodic scanning range, rate and frequency.

3 Claims, 5 Drawing Sheets

SYSTEM AND METHOD FOR PROVIDING SCANNING POLARIZED REFERENCE SOURCES

CROSS-REFERENCE TO RELATED APPLICATIONS

The present application is a continuation application of U.S. application Ser. No. 11/888,797 filed Aug. 2, 2007 which claims priority to U.S. provisional patent application, Ser. No. 60/835,022, filed on Aug. 2, 2006, the entire contents of each of which is incorporated herein by reference.

BACKGROUND OF THE INVENTION

1. Field of the Invention

The present invention relates generally to scanning sources and, more particularly, to systems and methods for providing scanning polarized reference sources.

2. Prior Art

For guidance and/or steering purposes, all manned and unmanned mobile platforms, such as land vehicles, powered or non-powered airborne platforms, surface or submerged marine platforms, or various space vehicles, require onboard information as to their absolute (relative to earth) position and orientation (sometimes called attitude) or their position and orientation relative to another object such as a reference platform or a target object.

This position and orientation information is particularly important for unmanned and guided platforms such as mobile robots. Unmanned Aerial Vehicles (UAV), unmanned guided surface or submerged platforms, and the like. This is also the case in future smart and guided projectiles, including gun-fired munitions, mortars and missiles. Such platforms will also require the aforementioned absolute and/or relative position and orientation information onboard the platform for closing the feedback guidance and control loop to guide the platform to the desired target or track a specified trajectory or the like.

In certain cases, the onboard position and orientation information (absolute or relative to the target, a reference station, another mobile platform, etc.) can be provided by an outside source, for example, by GPS for position or by a radar reading or optical signal that is reflected off some target or received by the mobile platform. In other cases, it is either required or is highly desirable to have autonomous sensors on board the mobile platform, including gun-fired projectiles, mortars and missiles, to directly measure the position and orientation of the object with respect to a fixed object (for example a ground station) or a moving object (for example a moving target).

It is noted that even though in this disclosure all references are made to moving platforms, it will be appreciated by those of ordinary skill in the art that the provided description also includes the measurement of the position and orientation of one object relative to another object, one or both of which may be fixed to a third object such as the ground.

Currently available sensors for remote measurement of the angular position (attitude) of an object relative to the earth or another object (target or weapon platform) can be divided into the following five major classes.

The first class of sensors measure changes in the angular position using inertial devices such as accelerometers and gyros. Inertial based angular orientation sensors, however, generally suffer from drift and noise error accumulation problems. In such sensors, the drift and the measurement errors are accumulated over time since the acceleration has to be integrated twice to determine the angular position. As a result, the error in the angular position measurement increases over time. In addition, the initial angular orientation and angular velocity of the object must be known accurately. Another shortcoming of inertia based angular position sensors is that the angular position of one object relative to another cannot be measured directly, i.e., the orientation of each object relative to the inertia frame has to be measured separately and used to determine their relative angular orientation. As a result, errors in both measurements are included in the relative angular orientation measurement, thereby increasing it even further. In addition, electrical energy has to be spent during the entire time to continuously make such sensory information.

In the particular case of gun-fired munitions, two other major problems are encountered with inertia-based sensors. Firstly, they have to be made to withstand firing accelerations that in certain cases could be in excess of 100,000 Gs. However, to achieve the required guidance and control accuracy over relatively long distances and related times, the absolute angular orientation of the projectile has to be known during the entire time of the flight within very small angles corresponding to sub-fractions of one G. As a result, the accelerometer is prone to a settling time problem, particularly with the aforementioned initial high G loading. Obviously, the development of inertia based accelerometers and gyros that could withstand the aforementioned high G levels and require near zero settling time is an extremely difficult task.

The second class of angular orientation sensors operates using optical methods. Such sensory systems can directly measure angular position of one object relative to another. However, optical based angular position sensory systems suffer from several disadvantages, including operation only in the line of sight between the two objects; accurate measurement of relative angular orientation only if the objects are relatively close to each other; limited range of angular orientation measurement; relatively high power requirement for operation; requirement of relatively clean environment to operate; and in military applications the possibility of exposing the site to the enemy and jamming. Optical gyros do not have most of the above shortcomings but are relatively large, require a considerable amount of power, and are difficult to harden for high G firing accelerations. Optical methods such as tracking of projectiles with surface mounted reflectors and the like have also been developed, which are extremely cumbersome to use even during verification testing, suffer from all the aforementioned shortcomings, and are impractical for fielded munitions. In addition, the information about the object orientation can usually be determined only at the ground station and has to be transmitted to the moving object for guidance and control purposes. As a result, optical angular position sensors are generally not suitable for munitions and other similar applications.

The third class of angular orientation sensors is magnetometers that can be used to measure orientation relative to the magnetic field of the earth. The main problem with magnetometers is that they cannot measure orientation of the object about the magnetic field of the earth. Other important issues are low sensitivity; requirement of an accurate map of the magnetic field in the area of operation; and sensitivity to the presence of vehicles and the like in the area, the configuration of which usually varies in time, particularly in an active war theatre.

The fourth class of angular orientation measurement systems are based on the use of radio frequency (RF) antennas printed or placed on the surface of an object to reflect RF energy emanating from a ground-based radar system. The reflected energy is then used to track the object on the way to its destination. With two moving objects, the radar measures the time difference between the return signals from each of the objects and thereby determines angular information in terms of the angle that the relative velocity vector makes with respect to a coordinate system fixed to one of the objects. With such systems, measurement of full spatial orientation of an object (relative to the fixed radar or a second object) is very difficult. In addition, the information about the object orientation is determined at the radar station and has to be transmitted back to the moving object(s) if it is to be used for course correction. It is also very difficult and costly to develop systems that could track multiple projectiles. It is noted that numerous variations of the above method and devices have been devised with all suffering from similar shortcomings.

In addition to the above angular orientation measurement sensors, GPS signals have also been used to provide angular orientation information. Such systems, however, have a number of significant shortcomings, particularly for munitions applications in general and gun fired munitions and mortars in particular. These include the fact that GPS signals may not be available along the full path of the flight; such orientation sensory systems are generally not very accurate; and the measurements cannot be made fast enough to make them suitable for guidance and control purposes in gun fired munitions and mortars. In addition, GPS signals are generally weak and prone to jamming.

The fifth class of angular orientation sensors is based on utilizing polarized Radio Frequency (RF) reference sources and mechanical cavities as described in U.S. Pat. Nos. 6,724,341 and 7,193,556 and U.S. patent application publication number 2007/0001051, all of which are incorporated herein by reference, and hereinafter are referred to as "polarized RF angular orientation sensors". These angular orientation sensors use highly directional mechanical cavities that are very sensitive to the orientation of the sensor relative to the reference source due to the cross-polarization and due to the geometry of the cavity. The reference source may be fixed on the ground or may be another mobile platform (object). Being based on RF carrier signals, the sensors provide a longer range of operation. The sensors can also work in and out of line of sight. In addition, the sensors make angular orientation measurements directly and would therefore not accumulate measurement error. The sensor waveguides receive and record the electromagnetic energy emitted by one or more polarized RF sources. The angular position of a waveguide relative to the reference source is indicated by the energy level that it receives. A system equipped with multiple such waveguides can then be used to form a full spatial orientation sensor. In addition, by providing more than one reference source, full spatial position of the munitions can also be measured onboard the munitions.

The aforementioned polarized RF based angular orientation sensors provide highly precise angular orientation measurements. The sensors, when embedded in a mobile platform such as in a projectile, can measure full angular orientation of the projectile (mobile platform) relative to the fixed ground station or another moving object such as a UAV or another projectile (mobile platform) where the reference source is located. These angular orientation sensors are autonomous, i.e., they do not acquire sensory information through communication with a ground, airborne or the like source. The sensors are relatively small and can be readily embedded into the structure of most mobile platforms including munitions without affecting their structural integrity. As a result, such sensors are inherently shock, vibration and high G acceleration hardened. A considerable volume is thereby saved for use for other gear and added payload. In addition, the sensors become capable of withstanding environmental conditions such as moisture, water, heat and the like, even the harsh environment experienced by munitions during firing. In addition, the sensors require a minimal amount of onboard power to operate.

The latter two classes of RF based full angular orientation and full position sensors promise to provide low cost, small volume and lightweight, low power, precision and autonomous onboard sensors for guidance and control of all mobile platforms, including future smart and precision guided munitions, as alternatives to inertia-based, optical, GPS and other similar currently available sensors.

The latter two classes of RF based full angular orientation sensors are dependent on the magnitude of the received signal at the sensors from the reference source to determine the orientation of the sensor relative to the reference source. This is the case, for example, for the aforementioned angular orientation sensors which are based on utilizing polarized Radio Frequency (RF) reference sources and mechanical cavities as described in U.S. Pat. Nos. 6,724,341 and 7,193,556 and U.S. patent application publication number 2007/0001051.

Briefly, referring now to FIGS. 1 and 2, there is shown a representation of a waveguide sensor 100 and its operation with respect to a polarized radio frequency (RF) reference (illuminating) source 101. An electromagnetic wave consists of orthogonal electric (E) and magnetic (H) fields. The electric field E and the magnetic field H of the illuminating beam are mutually orthogonal to the direction of propagation of the illumination beam. When polarized, the planes of E and H fields are fixed and stay unchanged in the direction of propagation. Thus, the illuminating source establishes a (reference) coordinate system with known and fixed orientation. The waveguide 100 reacts in a predictable manner to a polarized illumination beam. When three or more waveguides are distributed over the body of an object, and when the object is positioned at a known distance from the illuminating source, the amplitudes of the signals received by the waveguide sensor 100 can be used to determine the orientation of the object relative to the reference (illuminating) source 101, i.e., in the aforementioned reference coordinate system of the reference source 101. The requirement for the proper distribution of the waveguide sensors 100 over the body of the object is that at least three of the waveguides be neither parallel nor co-planar.

It is therefore observed that the aforementioned classes of RF based full angular orientation sensors are dependent on the magnitude of the received signal at the sensors from the reference source to determine the orientation of the sensor relative to the reference source. The use of the signal magnitude, however, has several major shortcomings that limits the utility of such sensors as well as degrades their angular orientation measurement precision. The following are the major shortcomings of the aforementioned use of signal magnitude information in these sensors for measuring angular orientation relative to the polarized RF reference source:

1. To relate the magnitude of the received signal to angular orientation, the distance from the reference source to the angular orientation sensors must be known. This in general means that other means have to be also provided to measure or indicate the position of the orientation sensor relative to the reference source.
2. In practice, the signal received at the angular orientation sensor would be noisy, it may face losses due to the environmental conditions, and is also prone to measurement errors at the sensor.
3. The magnitude of the signal received at the angular orientation sensors and its relationship to the angular orientation of the sensors (object to which the sensors are attached) could be significantly different when the object is not in the line-of-sight of the reference source. Therefore when the object is not in the line-of-sight, the use of the received signal magnitude information could in general lease to significant degradation of the accuracy of the angular orientation measurements.

SUMMARY OF THE INVENTION

The use of polarized RF reference sources with scanning capability would significantly reduce or eliminate the aforementioned shortcomings of the RF based full angular orientation sensors. This would be the case since scanning provides the means to use various well established techniques such as peak detection and a novel nonlinear signal processing method based on a curve matching and scaling, which is disclosed later in this disclosure, and thereby significantly increase the angular orientation measurement precision, in certain cases by several orders of magnitude; filtering out the noise and effects of reflections and multi-paths; making it possible to use these angular orientation sensors in both line-of-sight and non-line-of-sight settings; and also eliminates the need to know the distance between the reference source and the angular orientation sensors. It is also shown later in this disclosure that the use of polarized RF reference sources with scanning capability would have additional advantages. For example, the precision with which the angular orientation is measured by the sensors is not dependent on the accurate calibration of the received signal magnitude information (usually surfaces). In addition, particularly for line-of-sight applications, if such calibration has been made, then as discussed below, the information can be used to calculate the distance between the reference source to the sensors (object) as well.

In addition, when more than one polarized RF reference source is used to measure the position of the sensors (object) in the coordinate system fixed to the reference sources, the use of polarized RF reference sources with scanning capability would significantly increase the accuracy of these measurements.

A need therefore exists for polarized RF reference sources with scanning capability. This is particularly the case since such reference sources would allow the aforementioned RF angular orientation sensors to be used in both line-of-sight as well as in non-line-of-sight, in addition to making them significantly more accurate and tolerant to noise and other environmental effects, and when calibrated would allow them to measure distance between the reference source and the angular orientation sensors (object) in addition to the angular orientation measurement.

An objective of the present invention is to provide a method and system for polarized RF reference sources with scanning capability, thereby allowing a significant increase in the angular orientation measurement precision of the aforementioned angular orientation sensors; filtering out the noise and effects of reflections and multi-paths; making it possible to use these angular orientation sensors in both line-of-sight and non-line-of-sight settings; and measure the distance between the reference source and the angular orientation sensors (object), particularly in line-of-sight situations. Such polarized RF reference sources with scanning capability can be designed to provide almost any desired scanning range and scanning frequency, ranging from Hz to KHz or even MHz frequencies, even non-sinusoidal patterns, to fit the application at hand.

Another objective of the present invention is to provide a novel nonlinear signal processing method based on a curve matching and scaling technique, thereby increasing the accuracy of the angular orientation (and distance between the reference source and the sensors, i.e., object, particularly in line-of-sight situations) measurement of the aforementioned angular orientation sensors. In certain applications, the use of non-sinusoidal scanning patterns has added advantages, some of which are described below.

Another objective of the present invention is to provide a method and system for establishing an angular orientation reference source for a large area, for example the field of operation of certain mobile platforms, such as the field of operation of mobile robotic platforms being used for rescue operations in certain fields. Such a referencing system may be used to serve as a full positioning as well angular orientation system.

Yet another objective of the present invention is to provide the method and system of establishing "homing" planes and/or lines (with or without directional indication) and/or points. Such "homing" "signals" can then be used by the mobile platform for guidance, e.g., for guiding it towards or away from a point or move towards a line and then follow certain.

It is noted that the disclosed methods and systems can allow the scanning capability of the present polarized RF source to be achieved without the use of any mechanical components and by the use of simple electronic circuitry using modulated signals of various patterns. As a result, the scanner can achieve almost any rate, any scanning pattern, scanning frequencies ranging from zero to several Hz, or KHz, or MHz depending on the application at hand.

In addition, the disclosed polarized RF reference sources with scanning capability can be programmed to provide random scanning signals with very low power levels or on-off (pulsed) signals to avoid detection or utilize other detection avoidance procedures.

In addition, the disclosed method can readily allow the prior art polarized RF reference sources to scan more than one range, for example for providing a relatively narrow scanning range for more than one angular orientation.

BRIEF DESCRIPTION OF THE DRAWINGS

These and other features, aspects, and advantages of the apparatus of the present invention will become better understood with regard to the following description, appended claims, and accompanying drawings where:

DETAILED DESCRIPTION OF THE PREFERRED EMBODIMENT

Figure 1:
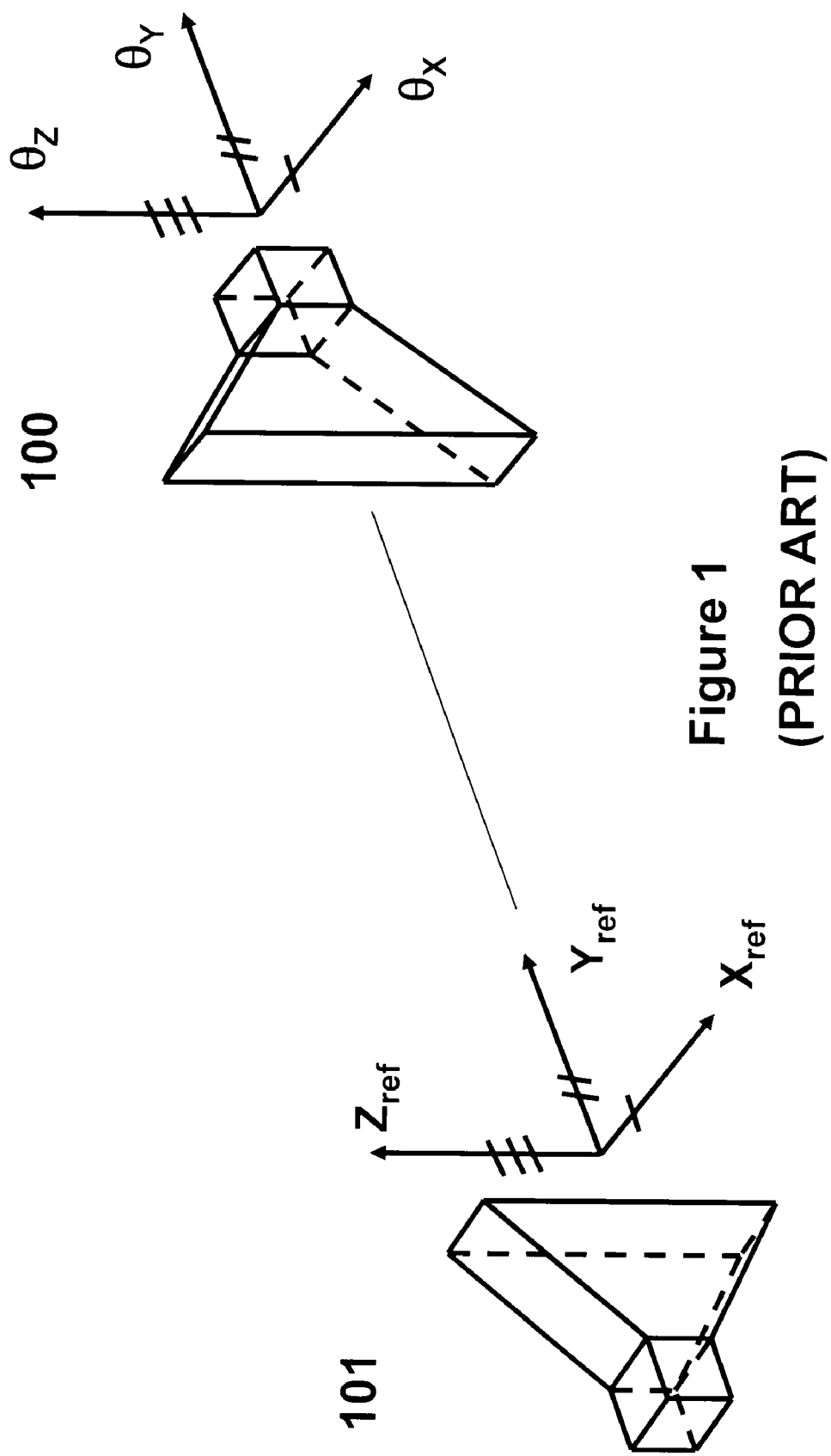
FIGS. 1 and 2 illustrate a schematic representation of a waveguide sensor with respect to a polarized radio frequency (RF) reference (illuminating) source of the prior art.
Figure 2:
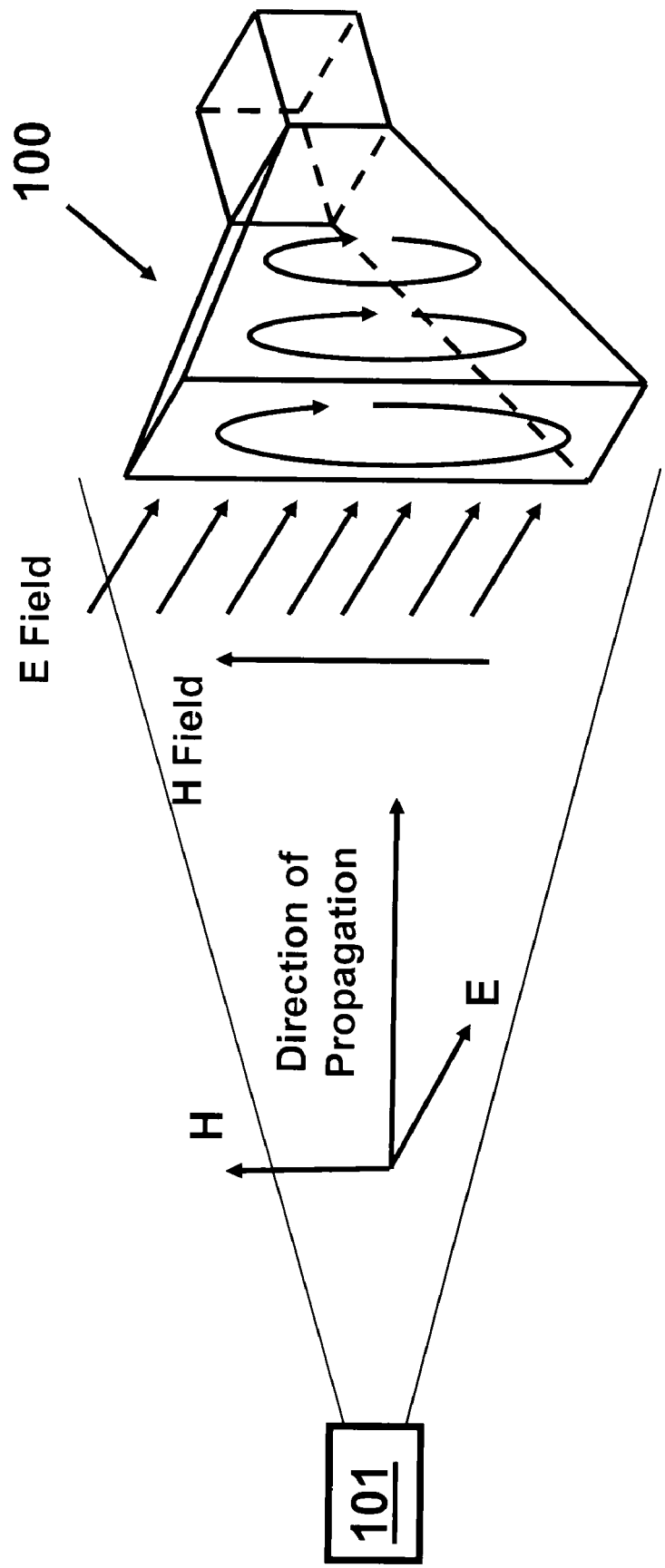

An electromagnetic wave is a propagation of electric and magnetic field disturbances in unison such that both electric and magnetic field vectors are perpendicular to the direction of propagation and to each other, they are in phase and in vacuum the ratio of their magnitude is constant. The wave is transverse (oscillations are perpendicular to the direction of propagation) and its velocity in free space is determined by the permittivity and permeability of free space. The polarization state of an electromagnetic wave is defined by the oscillation state of its transverse electric field in the plane perpendicular to propagation direction. Since the magnetic field is always perpendicular to the electric field and has a proportional magnitude it is redundant for the characterization of polarization. The magnitudes and phases of orthogonal components of electric field do not necessarily have the same values and the periodic curve traced out by the tip of the electric field vector describes the different states of polarization.

The electromagnetic waves in free space are described by the Maxwell equations without the charges and currents are $$\nabla E = 0$$

$$\nabla B = 0$$

$$\nabla \times E = -\frac{\partial B}{\partial t}$$

$$\nabla \times B = \varepsilon_0 \mu_0 \frac{\partial B}{\partial t}$$

where E and B are respectively the electric and magnetic (induction) fields, and $\varepsilon_0$ and $\mu_0$ respectively denote the permittivity and permeability of free space. From Maxwell's equations one derives the following linear wave equations $$\varepsilon_0 \mu_0 \frac{\partial E}{\partial t^2} = \nabla^2 E$$

$$\varepsilon_0 \mu_0 \frac{\partial^2 B}{\partial t^2} = \nabla^2 B$$

which implies that $$c = 1/\sqrt{\varepsilon_0 \mu_0}$$

the wave (phase) speed c.

To specify the polarization state of electromagnetic waves we look for the harmonic traveling plane wave solutions of the electric field wave equation describing the waves propagating in the z-direction. In orthogonal coordinates XYZ these solutions are given by $$E(z,t) = E_x i + E_y j - E_{0x} \cos(\omega - kz) + E_{0x} \cos(\omega - kz - \delta) j$$

where $\omega$ is the angular frequency, $\delta$ denotes the phase angle difference between the x and y components of electric field. k is the z-component of wave number vector which is related to the wavelength $\lambda$ with $|k-2\pi/\lambda$ and parallel to the direction of propagation. $E_{0x}$ and $E_{0y}$ are the (positive) amplitudes of x and y components of electric field components, respectively, and i and j are unit vectors in the x and y directions of the aforementioned Cartesian coordinate system XYZ.

Consider a situation in which the polarization states associated with the components $E_x$ and $E_y$ are given as $$E_x = E_{0x} \cos(\omega t - kz)$$

$$E_y = E_{0y} \cos(\omega t - kz + \delta)$$

Then the following characteristic can be defined:
a) For $\delta$:2 $\pi$n, n 1, 2, 3, . . . , the electric field components are in phase and their ratio $E_x$ $E_y$ is a positive constant, in this case we have a so-called linearly polarized or plane polarized wave. The tip of electric field vector traces out a line in the xy-plane which defines the polarization direction, and $$E_x = E_{0x} \cos(\omega t - kz)$$

$$E_y = E_{0y} \cos(\omega t - kz)$$

b) For $\delta$ −$\pi$:2 $\pi$ n, n 1, 2, 3, . . . , we have an out of phase linear polarization with the component ratio equal to a negative constant, and $$E_x = E_{0x} \cos(\omega t - kz)$$

$$E_y = -E_{0y} \cos(\omega t - kz)$$

c) For $\delta$ $\pi$ 2:2 $\pi$ n, n 1, 2, 3, . . . , and $E_{0x}$ $E_{0y}$, the electric field vector rotates in the xy-plane clockwise (as seen against propagation) without changing its magnitude and it is in a state of right circular polarization, and $$E_x = E_{0x} \cos(\omega t - kz)$$

$$E_y = -E_{0y} \sin(\omega t - kz)$$

d) For $\delta$ −$\pi$2:2 $\pi$ n, n 1, 2, 3, . . . , and $E_{x0}$ $E_{0y}$, the electric field rotates counterclockwise; this specifies a left circular polarization, and $$E_x = E_0 \cos(\omega t - kz)$$

$$E_y = E_0 \sin(\omega t - kz)$$

e) For $\delta$−$\pi$ 2=2 $\pi$ n, n−1, 2, 3, . . . and $E_{x0} \neq E_{0y}$, we have a more general case of right elliptical polarization. Electric field components have different amplitudes and the y-component leads with ninety degrees of phase; the tip electric field vector rotates clockwise and traces out an ellipse, and $$E_x = E_{0x} \cos(\omega t - kz)$$

$$E_y = -E_{0y} \sin(\omega t - kz)$$

f) For $\delta$ −$\pi$ 2−2 $\pi$ n, n−1, 2, 3, . . . and $E_{x0} \neq E_{0y}$, the electric field rotates counterclockwise and its tip again traces out an ellipse; this is a state of left elliptical polarization.

In the general case $$E_x = E_{0x} \cos(\omega t - kz)$$

$$E_y = E_{0y} \cos(\omega t - kz + \delta)$$

where the magnitudes of electric field components $E_{0x}$ and $E_{0y}$ are not necessarily equal and value of the phase difference $\delta$ is arbitrary, one can derive the curve traced out by the tip of electric field vector in the xy-plane (which is the plane of electric field components). By eliminating the phase ($\omega$t kz) we obtain $$\left(\frac{E_x}{E_{0_x}}\right)^2 + \left(\frac{E_y}{E_{0_y}}\right)^2 - 2\left(\frac{E_x}{E_{0_x}}\right)\left(\frac{E_y}{E_{0_y}}\right)\cos\delta = \sin^2\delta$$

which specifies a tilted ellipse in $E_x$ and $E_y$ coordinates. The azimuth angle $\psi$ ($0 \leq \psi \leq \pi$ 2) between the x-axis and the major semi-axis of this ellipse then becomes $$\tan 2\psi = \left(\frac{2E_{0_x} E_{0_y}}{E_{0_x}^2 - E_{0_y}^2}\right)\cos\delta$$

The following relations are also valid between the amplitudes of the electric field components and the lengths a and b of semi-major and semi-minor axes which specify the ellipticity of the polarization ellipse:

$$a^2 \cdot b^2 E_{0_x}{}^2 | E_{0_y}{}^2 \qquad 1.$$

$$2 \cdot a\, b = E_{0_x}{}^2 E_{0_y}{}^2 \sin \delta \qquad 2.$$

where the signs specify the sense of electric field rotation.

$$\tan 2\psi \tan \alpha \cos \delta \qquad 3.$$

where $\tan \alpha = E_{0x}/E_{0y}$ and $0 \leq \alpha \leq \pi/2$ $$\sin 2\phi = \tan \alpha \sin \delta \qquad 4.$$

with $\tan \gamma \phi = (b/a)$, where $-(\pi/4) \leq \phi \leq )\pi/4)$.

For the phase difference $\delta=0$ and $\delta=\pi$, the ellipse degenerates to $$E_y = \pm \left(\frac{E_{0y}}{E_{0x}}\right) E_x$$

which is the equation of a straight line, and it specifies a linear polarization. For $\delta=\pi/2$ and $E_{0x}=E_{0y}=E_0$, the elliptical polarization curve reduces to a circle, which defines a circular polarization $$E_x^2 + E_y^2 = E_0^2$$

The novel methods disclosed herein utilize amplitude modulation of at least two synchronized polarized Radio Frequency (RF) carrier signals with an appropriate relationship between their amplitude modulation of their electric field components and their polarization states to provide a scanning polarized RF reference source with the desired scanning range, pattern and frequency. The polarized RF carrier signals are preferably in GHz range to yield relatively small scanning polarized RF reference sources.

As it is noted above, at least two synchronized polarized Radio Frequency (RF) carrier signals with appropriate relationship between their amplitude modulation are required to construct the disclosed polarized RF reference sources with scanning capability. In the following formulations and for the sake of making the formulations simple, the present novel method of providing scanning polarized RF reference sources is described for two synchronized polarized Radio Frequency (RF) carrier signals $E_1$ and $E_2$, where both are linearly polarized, one with only a component in the x and one with only a component in the y direction of the aforementioned Cartesian coordinate system XYZ, as $$E_1 = E_x \cos(\omega - kz) i$$

$$E_2 = E_y \cos(\omega - kz|\delta) j$$

where $\omega$ is the angular frequency, $\delta$ denotes the phase angle difference between the two electric fields, x and y components of electric field, k is the z-component of wave number vector. It is sufficient to concentrate on the behavior of this field in the z–0 plane to see the effects of amplitude modulation. Formally amplitude modulation is represented by replacing the amplitudes $E_x$ and $E_y$ of the above electric fields by functions of time as $$E_x = A_x(t) \cos(\omega t)$$

$$E_y = A_y(t) \cos(\omega t + \delta)$$

where the modulation amplitudes $A_x$ and $A_y$ may be any functions, but preferably a superposition of many harmonic functions corresponding to a range of modulation frequencies and they can represent various waveforms. In general, the variations of modulation amplitudes are desired to be significantly slower relative to the fast oscillations of the carrier waves. i.e., they are almost 'constant' on a time duration of the order of one period of these fast oscillations.

A relatively simple amplitude modulation of the above polarized carrier waves may be selected as $$E_x = E_{0x}(1 + m_x \sin \Omega t) \cos \omega t$$

$$E_y = E_{0y}(1 + m_y \sin \Omega t) \cos(\omega t \delta)$$

where $\Omega$ is the angular modulation frequency (in our case, the scanning frequency of the desired scanning polarized RF reference source), which is much smaller than $\omega$ and the constants $m_x$ and $m_y$ denote the modulation indices of x and y components. These indices are generally smaller than unity to avoid 'over-modulation'. Specifically we may, for example, choose a left elliptical polarization (counterclockwise rotation) by setting $\delta=-\pi/2$ and write $$E_x = E_{0x}(1 + m_x \sin \Omega t) \cos \omega t$$

$$E_y = E_{0y}(1 + m_y \sin \Omega t) \sin \omega t$$

These components are not periodic functions of a single common frequency and the curve defined by the electric field vector is not 'closed'; however a particular value of the modulation frequency $\Omega$ can be chosen to satisfy these conditions. Let us impose the condition that there is a common period T between the modulation and carrier signals. The periodicity condition for the x-component $$E_x = E_{0x}[1 + m_x \sin \Omega(t+T)] \cos \omega(t+T) = E_{0x}(1 + m_x \sin \Omega t) \cos \omega t$$

is satisfied if $$\Omega = \frac{n}{m} \omega$$

for some integers n and m. Thus if the ratio of modulation and carrier frequencies is a rational number then one can choose a single period for the x-component (same is also true for the y-component). In addition, to have a periodic (closed) curve traced out by the tip of electric field vector there must be a common period between the field components. The components $E_x$ and $E_y$ can also be written as $$E_x = E_{0x} \cos \omega t + \frac{E_{0x} m_x}{2} \sin[(\omega + \Omega)t] - \frac{E_{0x} m_x}{2} \sin[(\omega - \Omega)t]$$

$$E_x = E_{0y} \sin \omega t + \frac{E_{0y} m_y}{2} \cos[(\omega - \Omega)t] - \frac{E_{0y} m_y}{2} \cos[(\omega + \Omega)t]$$

which reveal the sideband frequencies $\omega - \Omega$ and $\omega + \Omega$. The ellipse equation specified by the tip of modulated electric field (for $\delta=-\pi/2$) transforms to $$\frac{1}{M_x^2}\left(\frac{E_x}{E_{0x}}\right)^2 + \frac{1}{M_y^2}\left(\frac{E_y}{E_{0y}}\right)^2 = 1$$

where we set $$M_x \equiv (1 + m_x \sin \Omega t)$$

$$M_y \equiv (1 + m_y \sin \Omega t)$$

This represents a 'modulated ellipse' whose semi-major and semi-minor 'axes' change their lengths periodically and relatively slowly with a frequency $\Omega$. If the magnitudes of the electric field components are equal, say to $E_0$, the circular polarization is modulated to an elliptical one with periodically changing axial lengths as described by $$\left(\frac{E_x}{E_0 M_x}\right)^2 + \left(\frac{E_y}{E_0 M_y}\right)^2 = 1$$

One embodiment is the general case or linear polarization in which the slope of polarization plane is replaced by a periodic function.

$$E_y = \pm \frac{E_{0_y}}{E_{0_x}} \left(\frac{1 + m_y \sin\Omega t}{1 + m_x \sin\Omega t}\right) E_x \quad (1)$$

Thus if the modulation indices of the two components of the electric fields $E_{0x}$ and $E_{0y}$ are equal (i.e., if $m_y = m_x$), then the slope of polarization line remains the same. This is obviously not of interest since the polarization line is not varied over a certain range. i.e., the resulting polarized RF reference source does not have a scanning feature.

However, if for example, only the y-component is modulated. i.e., if $m_x = 0$, and an in-phase polarization is considered, the slope of polarization line is replaced by a simple periodically changing function given in equation (2), and the polarization line would vary over a certain range depending on the values of the parameters $m_y$, $E_{0x}$, and $E_{0y}$, and the resulting polarized RF reference would therefore become a scanning polarized RF reference source:

$$E_y = \frac{E_{0_y}}{E_{0_x}} (1 + m_y \sin\Omega t) E_x \quad (2)$$

which is the 'trace' of curve $E_x = E_{0x} \cos \omega t$ $E_y = E_{0x}(1 + m_y \sin \Omega t) \cos \Omega t$ True trace, set of points ($E_x$, $E_y$) lying on the curve, is obtained by entirely eliminating the time variable $$E_y = \frac{E_{0_y}}{E_{0_x}} \left\{ 1 + m_y \sin\left[\left(\frac{\Omega}{\omega}\right) \cos^{-1}\left(\frac{E_x}{E_{0_x}}\right)\right] \right\} E_x \quad (4)$$

For $\Omega \ll \omega$ sin function can be approximated by its argument, reducing the curve to $$E_y = \frac{E_{0_y}}{E_{0_x}} \left[ 1 + m_y \left(\frac{\Omega}{\omega}\right) \cos^{-1}\left(\frac{E_x}{E_{0_x}}\right) \right] E_x \quad (5)$$

The equation (1) represents one of the simplest (harmonic) classes of amplitude modulation for the present novel scanning polarized RF reference sources constructed with two synchronized polarized Radio Frequency (RF) carrier signals with appropriate relationship between their amplitude modulation. It will however, be appreciated by those of ordinary skill in the art that an infinite number of such classes of periodic and even non-periodic functions may be formed with two or more synchronized polarized Radio Frequency (RF) carrier signals with appropriate relationship between their amplitude modulation to obtain varieties of preferably periodic and even non-periodic scanning ranges, rates and "scanning pattern" (hereinafter, the time history of the polarization line is referred to as the "scanning pattern").

In addition, even though the above two superimposed linearly polarized plane waves were in orthogonal directions, the only requirement to achieve the desired scanning range and pattern is that the two (or more) waves not be collinear. In fact, for relatively small scanning ranges, the E vector of the two linearly polarized plane waves may be desired to be less than 90 degrees apart to minimize the required scanner power for the same power levels at the receiving sensor position.

It is noted that the selection of an appropriate scanning pattern is dependent on the application at hand, for example for the polarized RF angular orientation measurement sensors previously described, and the algorithms used to extract the desired information, for example peak detection and/or pattern matching for angular orientation measurement.

In one embodiment, the classes of amplitude modulation represented by equation is used to construct scanning polarized RF reference sources with two synchronized polarized Radio Frequency (RF) carrier signals as previously described. One of the simplest versions of this class of amplitude modulation may be obtained by setting the component $m_x$ 0, thereby obtaining a "scanning pattern" that consists of a simple harmonic motion, equation (2). For the simple harmonic scanning pattern given by equation (2), the parameters consisting of the two constant magnitudes of the two components of the electric fields $E_{0x}$ and $E_{0y}$, and the constant modulation index of the y component $m_y$, determine the mean direction of the polarization line and the range of the scanning angle.

Figure 3:
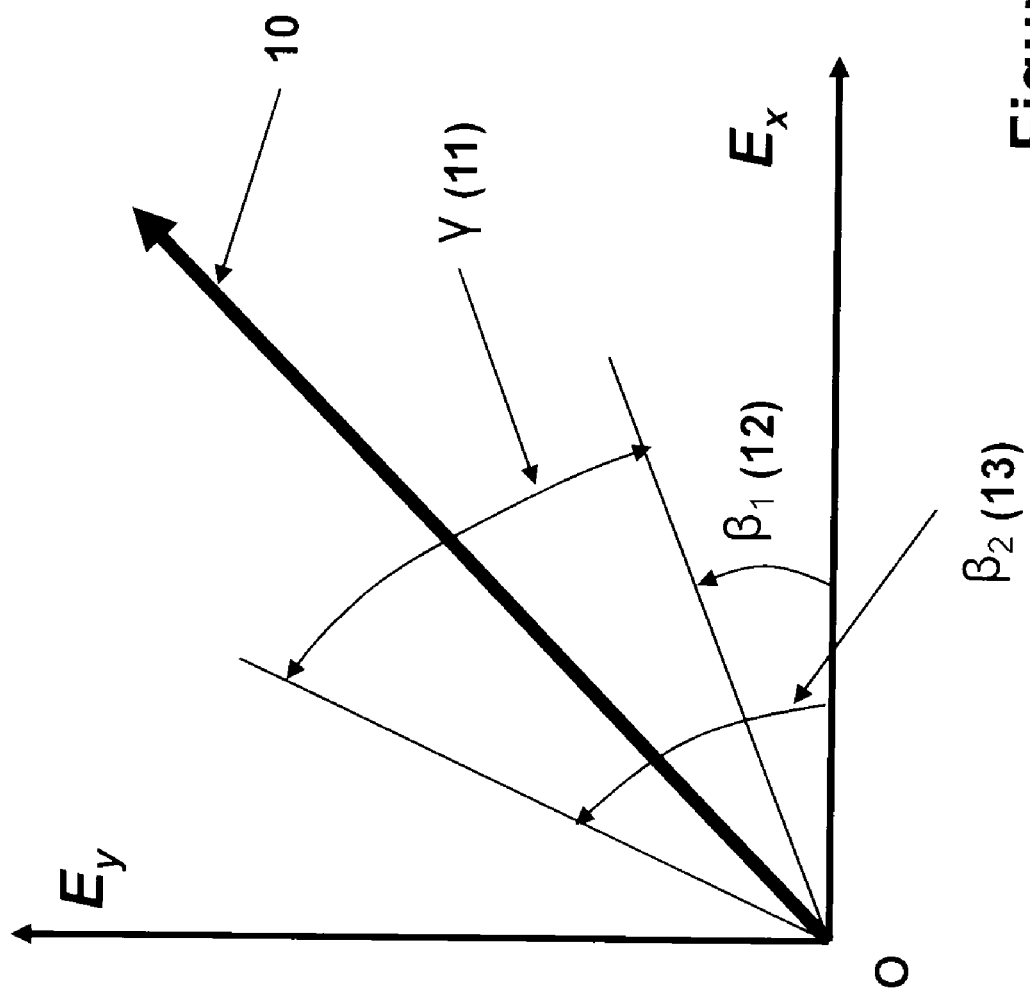
FIG. 3 illustrates a graph where $m_x=0$, $m_y=0.5$, and $E_{0x}=E_{0y}$, and the reference sources are positioned at the origin of the Cartesian XY coordinate system O.

For example, consider the case of $m_x = 0$, $m_y = 0.5$, and $E_{0x} = E_{0y}$, and considering that the reference sources are positioned at the origin of the Cartesian XY coordinate system O, FIG. 3. Then the polarization line 10 is readily shown to scan from the angle $\beta_1 = 26.6$ deg. (obtained by setting Sin $\Omega$ t=−1 in equation (2) to obtain the slope of the polarization line. i.e., $\beta_1 = \tan^{-1}(E_y/E_x) = \tan^{-1}(0.5) = 26.6$ deg.), also indicated as numeral 12 in FIG. 3, to $\beta_2 = 56.3$ deg. (obtained by setting Sin $\Omega$ t=1 in equation (2) to obtain the slope of the polarization line, i.e., $\beta_2 = \tan^{-1}(E_y/E_x) = \tan^{-1}(1.5) = 56.3$ deg.), also indicated as numeral 13 in FIG. 3, for a total range of the scanning angle of about $\gamma = 29.7$ degrees, also indicated as numeral 11 in FIG. 3.

As can be seen in FIG. 3, with the selected parameters for the scanning pattern described by equation (2), a range of about 29.7 degrees 11 can be scanned. In a similar manner, by choosing different values for the constant parameters $m_x$, $m_y$, $E_{0x}$, and $E_{0y}$, different mean direction and scanning ranges are obtained with the scanning pattern described by the equation (1).

In general, any desired scanning pattern may be implemented with the proposed method. For example, one may choose scanning patterns with peaks that are sharper than a simple harmonic sine wave, thereby increasing the accuracy of a peak detection algorithm. Alternatively, one may add specially designed patterns that will simplify a pattern detection algorithm being used and/or to reject noise, and/or to reduce their susceptibility to detection and jamming, or for other application specific purposes.

It is noted that the following method may also be used to provide two or even more simultaneous and arbitrarily oriented scanning reference sources. Such multi-range scanning is useful for the establishment of a network of reference sources and/or to limit the range or radiation when multiple sensors (for example, munitions and/or weapon platforms) are using the reference source.

It is noted that the linearly polarized and synchronized Radio Frequency (RF) carrier signals used to construct the disclosed scanning polarized RF reference sources (for example, the two linearly polarized plane waves $E_y$ and $E_x$ of equation (2) that were superimposed in the above formulations) may be generated using almost any of the methods and devices that are commonly used in the art, including by using aperture antennas. It is also noted that in many applications, such as in the guidance and control of most mobile platforms, the angular orientation and/or position information may not need to be known as a continuous function of time and information may be required (for example for guidance and control purposes) only at discrete and sometimes even at infrequent points of time. In such applications, the scanning polarized RF reference source needs to provide its signal only when the aforementioned angular orientation and/or position information is needed onboard the mobile platform.

In another embodiment, at least two scanning polarized RF reference sources may be used so that the aforementioned polarized RF based angular orientation sensors, for example mounted on a mobile platform, could determine the position and/or orientation of the sensors, i.e., the mobile platform, relative to the scanning polarized RF reference sources.

Figure 4:
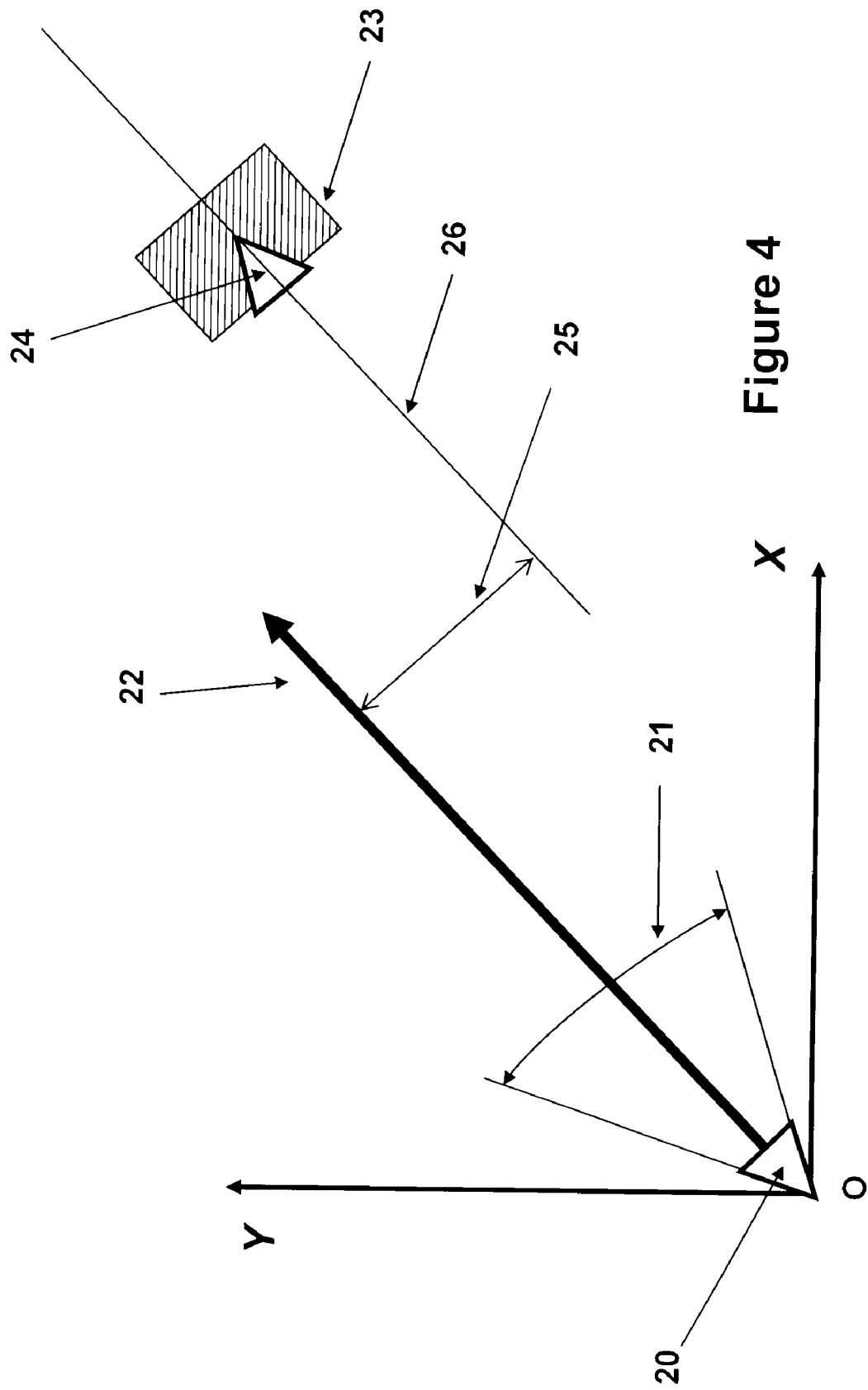
FIG. 4 illustrates a scanning polarized RF reference source positioned at the origin of the Cartesian XYZ coordinate system.

Now consider the situation in which a scanning polarized RF reference source 20 is positioned at the origin O of the Cartesian XYZ coordinate system as shown in FIG. 4. The scanning polarized RF reference source 20 is considered to have a scanning range 21, with the mean direction of the polarization line (for example, with a simple harmonic pattern previously described) indicated by the vector 22. Now let an object (e.g., a mobile platform) 23 with an embedded aforementioned polarized RF angular orientation sensor 24 that is properly designed to receive the carrier frequency signal to be positioned as shown in FIG. 4. Using well known peak detection techniques, the direction 26 of a line passing through the polarized RF angular orientation sensor 24 and parallel with the direction of the mean direction of the polarization line, i.e., the vector 22 is determined.

It is noted that if the line 26 coincides with the mean direction of the polarization line 22, then the signal received at the polarized RF angular orientation sensor 24 is maximum and the distance 25 between the lines 26 and 22 is zero. For example, if the scanning pattern of the scanning polarized RF reference source 20 is a simple harmonic pattern as previously described, then the peak of the received signal is reached when the mean direction of the polarization line 22 intersects the polarized RF angular orientation sensor 24 and signal received by the sensor 24 is also substantially a simple harmonic signal (neglecting any noise and other commonly present sources of distortion). However, if the distance 25 between the lines 26 and 22 is not zero, then the signal received by the sensor 24 is distorted with the peak leaning to one side or the other depending on whether the line 26 is placed below the mean direction of the polarization line 22 (as shown in FIG. 4) or on its opposite side.

The amount of above peak distortion would therefore serve as a sensory information indicating the direction that the mobile platform 23 has to travel (perpendicular to the line 26) in order to reduce the distance 25, and would also provide the information onboard the mobile platform 23 indicating when it is positioned along the mean direction of the polarization line 22. It can therefore be said that the polarized RF angular orientation sensor 24 that is attached to the mobile platform 23 can use the signal from the scanning polarized RF reference source 20 to "home-in" and align itself to the mean direction of the polarization line 22.

It is noted that if the distance between the scanning polarized RF reference source 20 and the line 26 is known, then for an arbitrary positioning of the mobile platform 23, the distance 25 between the lines 22 and 26 can in general be determined from the magnitude of the received signal.

Figure 5:
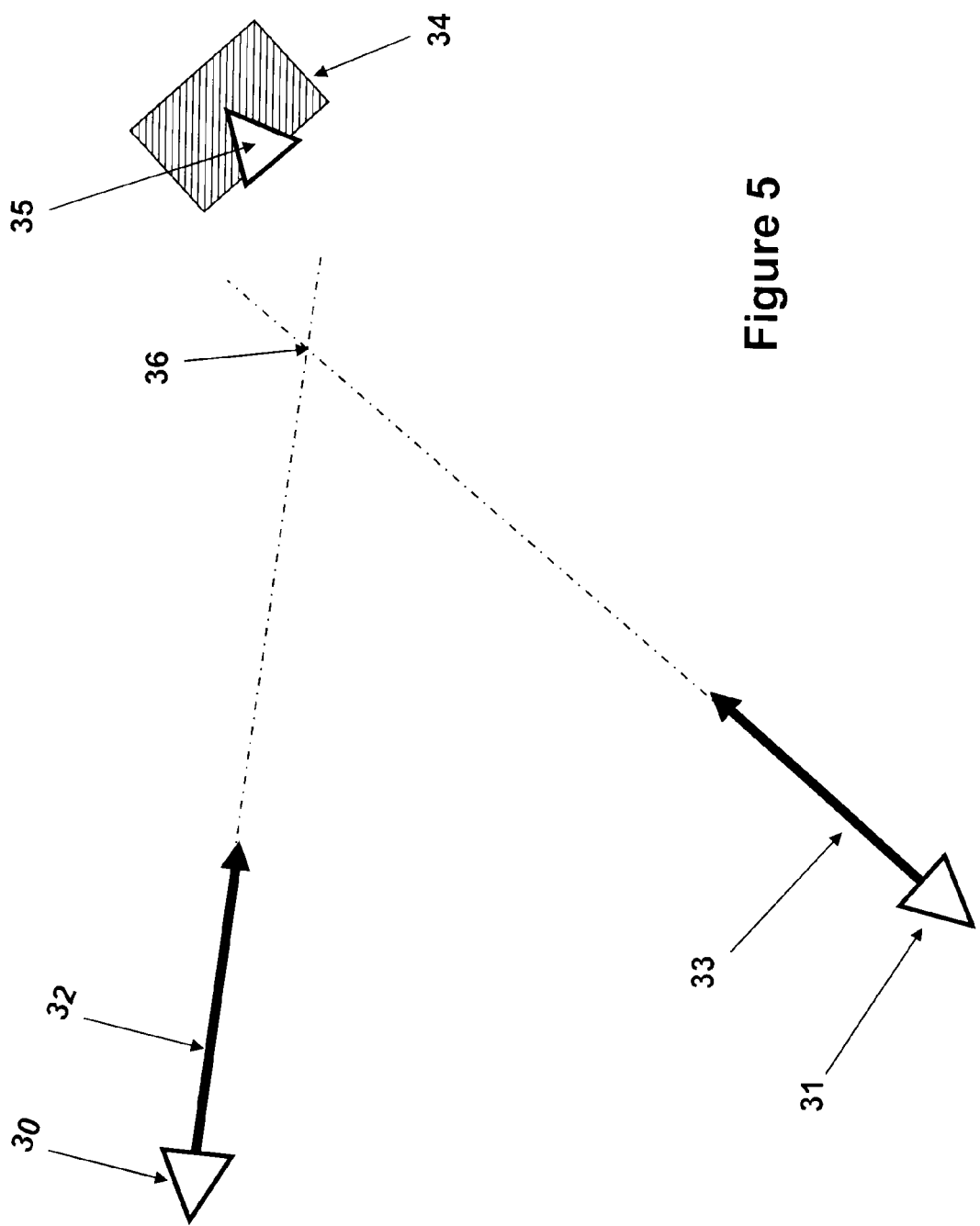
FIG. 5 illustrates two scanning polarized RF reference sources with corresponding mean directions of polarization lines.

Now consider the situation in which two (or more) scanning polarized RF reference sources 30 and 31 with corresponding mean directions of the polarization lines 32 and 33, respectively, are used as shown in FIG. 5. Let also a mobile platform 34 with at least one polarized RF angular orientation sensor 35 be positioned somewhere a distance away but in the scanning range of the two scanning polarized RF reference sources 30 and 31 as shown in FIG. 5. Using the method described above, the pattern of the signal received at the polarized RF angular orientation sensor 35 from each one of the two scanning polarized RF reference sources 30 and 31, the polarized RF angular orientation sensor 35 would provide sensory information to the mobile platform 34 for guidance (homing-in) towards the mean direction of the polarization lines 32 and 33, i.e., towards the point of their intersection 36. The only requirement for this mode of operation of the scanning polarized RF reference sources is that the two mean directions of the polarization lines 32 and 33 are not parallel.

It is noted that the polarization lines 32 and 33 are in fact the intersections of planes of polarization with the XY plane (FIG. 4). The aforementioned point of intersection 36 (FIG. 5) is also a line perpendicular to the above XY plane and directed parallel to the Z axis of the Cartesian XYZ coordinate system (FIG. 4).

It is noted that by varying the direction of the polarization line 32 and 33 (FIG. 5), the point of their intersection 36 towards which the mobile platform 34 is guided can be changed in a dynamic mode.

It is also noted that by using at least three scanning polarized RF reference sources that are properly oriented, a mobile platform may be directed to any position in space.

In general, by using more scanning polarized RF reference sources than are necessary, the positioning precision of the above methods is increased.

Although the scanning source has been described in terms of RF energy, other types of energy can also be used, such as x-rays.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A method of providing a polarized radio frequency scanning source, the method comprising amplitude modulating at least two synchronized polarized radio frequency (RF) carrier signals with a predetermined relationship between their amplitude modulation of their electric field components and their polarization states to provide a scanning polarized RF reference source with a predetermined scanning range, pattern and frequency.

2. The method of claim 1, wherein the two or more synchronized polarized RF carrier signals with the predetermined relationship between their amplitude modulation obtain a periodic scanning range, rate and frequency.

3. The method of claim 1, wherein the two or more synchronized polarized RF carrier signals with the predetermined relationship between their amplitude modulation obtain a non-periodic scanning range, rate and frequency.

* * * * *